United States Patent
Hsu et al.

(10) Patent No.: US 11,227,846 B2
(45) Date of Patent: Jan. 18, 2022

(54) SEMICONDUCTOR PACKAGE HAVING IMPROVED THERMAL INTERFACE BETWEEN SEMICONDUCTOR DIE AND HEAT SPREADING STRUCTURE

(71) Applicant: MEDIATEK INC., Hsin-Chu (TW)

(72) Inventors: Chia-Hao Hsu, Hsinchu (TW); Tai-Yu Chen, Hsinchu (TW); Shiann-Tsong Tsai, Hsinchu (TW); Hsing-Chih Liu, Hsinchu (TW); Yao-Pang Hsu, Hsinchu (TW); Chi-Yuan Chen, Hsinchu (TW); Chung-Fa Lee, Hsinchu (TW)

(73) Assignee: MEDIATEK INC., Hsin-Chu (TW)

(*) Notice: Subject to any disclaimer, the term of this patent is extended or adjusted under 35 U.S.C. 154(b) by 6 days.

(21) Appl. No.: 16/742,850

(22) Filed: Jan. 14, 2020

(65) Prior Publication Data

US 2020/0243462 A1 Jul. 30, 2020

Related U.S. Application Data

(60) Provisional application No. 62/798,589, filed on Jan. 30, 2019, provisional application No. 62/881,423, filed on Aug. 1, 2019.

(51) Int. Cl.
*H01L 27/14* (2006.01)
*H01L 23/66* (2006.01)
(Continued)

(52) U.S. Cl.
CPC .......... *H01L 23/66* (2013.01); *H01L 23/3672* (2013.01); *H01L 23/3733* (2013.01); *H01L 23/49822* (2013.01); *H01L 23/49838* (2013.01); *H01L 24/16* (2013.01); *H01Q 1/02* (2013.01); *H01Q 1/2283* (2013.01); *H01L 2223/6677* (2013.01); *H01L 2224/16227* (2013.01); *H01L 2924/0103* (2013.01);
(Continued)

(58) Field of Classification Search
None
See application file for complete search history.

(56) References Cited

U.S. PATENT DOCUMENTS 5,990,550 A * 11/1999 Umezawa ............. H01L 23/367
257/697
6,734,552 B2 5/2004 Combs
(Continued)

FOREIGN PATENT DOCUMENTS

| CN | 209029362 U | 6/2019 |
| CN | 209029363 U | 6/2019 |
| TW | 201901864 A | 1/2019 |

*Primary Examiner* — Hung K Vu
(74) *Attorney, Agent, or Firm* — Winston Hsu

(57) ABSTRACT

A semiconductor package includes a base having an upper surface and a lower surface opposite to the upper surface. An antenna array structure is embedded at the upper surface of the base. An IC die is mounted on the lower surface of the base in a flip-chip manner so that a backside of the IC die is available for heat dissipation. Solder ball pads are disposed on the lower surface of the base and arranged around the IC die. The semiconductor package further includes a metal thermal interface layer having a backside metal layer that is in direct contact with the backside of the IC die, and a solder paste conformally printed on the backside metal layer.

14 Claims, 6 Drawing Sheets

(51) Int. Cl.
*H01L 23/367* (2006.01)
*H01L 23/373* (2006.01)
*H01L 23/498* (2006.01)
*H01L 23/00* (2006.01)
*H01Q 1/02* (2006.01)
*H01Q 1/22* (2006.01)

(52) U.S. Cl.
CPC .............. *H01L 2924/014* (2013.01); *H01L 2924/0105* (2013.01); *H01L 2924/01029* (2013.01); *H01L 2924/01047* (2013.01); *H01L 2924/01049* (2013.01); *H01L 2924/01051* (2013.01); *H01L 2924/01083* (2013.01); *H01L 2924/18161* (2013.01)

(56) References Cited

U.S. PATENT DOCUMENTS

| | | |
|---|---|---|
| 6,818,980 B1 | 11/2004 | Pedron, Jr. |
| 10,424,559 B2 | 9/2019 | Eid |
| 2008/0291115 A1* | 11/2008 | Doan ................ H01Q 21/0087 343/893 |
| 2012/0126396 A1 | 5/2012 | Zhao |
| 2016/0049723 A1* | 2/2016 | Baks .................... H01Q 1/2291 343/848 |
| 2018/0110158 A1 | 4/2018 | Talpallikar |
| 2020/0006187 A1* | 1/2020 | Otremba ............. H01L 23/3735 |

* cited by examiner

SEMICONDUCTOR PACKAGE HAVING IMPROVED THERMAL INTERFACE BETWEEN SEMICONDUCTOR DIE AND HEAT SPREADING STRUCTURE

CROSS REFERENCE TO RELATED APPLICATIONS

This application claims priority from U.S. provisional application No. 62/798,589 filed Jan. 30, 2019 and priority from U.S. provisional application No. 62/881,423 filed Aug. 1, 2019. All of the above-mentioned applications are included in their entirety herein by reference.

BACKGROUND

As known in the art, a semiconductor chip package typically comprises an integrated circuit (IC) die and a molding compound that encapsulates the IC die. During operation, the IC die generates significant amount of heat, which can cause damage to the IC die or reduce the IC reliability. In a hybrid chip scale package (hybrid CSP), for example, the heat generated from one IC die such as an SoC die can be detrimental to the proximate IC die such as a DRAM die stacked on the SoC die, which leads to reduced overall chip performance.

To dissipate heat away from the IC die, the semiconductor chip package is often connected with an external heat spreading structure such as a heat spreader or heat sink attached to the IC die. To spread heat to the ambient environment, the heat spreading structure is often mounted onto a contact surface of the semiconductor chip package by applying a thermal interface material (TIM) such as thermal greases or conductive polymers on the contact surface.

However, the conventional thermal solution involving the use of TIM is not satisfactory. The conventional design using the TIM has problems such as thermal bottleneck and poor adhesion. It is desirable to have low contact resistance and good thermal interface between the IC die and the heat spreading structures for efficient heat conduction from the IC die through the heat spreading structures. It is also desirable to provide an improved heat transfer mechanism/medium employed between the components to effectively transfer heat away from the IC die.

SUMMARY

It is one object of the present disclosure to provide an improved semiconductor package with an improved thermal interface in order to solve the above-mentioned prior art shortcomings or problems.

According to one aspect of the present disclosure, a semiconductor package including a base comprising an upper surface and a lower surface that is opposite to the upper surface; a radio-frequency (RF) structure embedded near the upper surface of the base; an integrated circuit (IC) die mounted on the lower surface of the base in a flip-chip manner so that a backside of the IC die is available for heat dissipation; a plurality of solder ball pads disposed on the lower surface of the base and arranged around the IC die; and a metal thermal interface layer comprising a backside metal layer that is in direct contact with the backside of the IC die, and a solder paste conformally printed on the backside metal layer.

According to some embodiments, the RF structure comprises a top antenna layer and a bottom antenna layer spaced apart from the top antenna layer, and at least one dielectric layer interposed between the top antenna layer and the bottom antenna layer.

According to some embodiments, the backside metal layer comprises Au.

According to some embodiments, the solder paste comprises lead-free solder comprising tin, copper, silver, bismuth, indium, zinc, or antimony.

According to some embodiments, the base comprises metal traces and vias for interconnection.

According to some embodiments, the solder ball pads are electrically connected to the RF structure of the base through the metal traces and vias.

According to some embodiments, the IC die is an RFIC die.

According to some embodiments, the semiconductor package further comprises an underfill disposed in the gap between the IC die and the lower surface of the base.

According to some embodiments, a combined thickness of the underfill, the IC die, and the metal thermal interface layer is substantially equal to a ball height of the solder balls measured from the lower surface of the base.

According to some embodiments, the solder paste is thicker than the backside metal layer.

Another aspect of the invention provides a printed circuit board assembly including a printed circuit board having an upper surface directly facing the lower surface of the base, wherein the printed circuit board comprises an array of copper thermal pads on the upper surface of the printed circuit board, a plurality of thermal vias within the printed circuit board under the array of copper thermal pads, a heat spreading structure mounted onto s lower surface of the printed circuit board, wherein the heat spreading structure is in thermal contact with the plurality of thermal vias. The semiconductor package is mounted on the array of copper thermal pads.

According to some embodiments, the plurality of thermal vias comprises plated though holes.

According to some embodiments, the heat spreading structure comprises a heat sink.

According to some embodiments, the solder paste is in direct contact with the array of copper thermal pads.

According to some embodiments, the array of copper thermal pads comprises slits between the thermal pads and the slits are filled with the solder paste.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention can be more fully understood by reading the subsequent detailed description and examples with references made to the accompanying drawings, wherein.

DETAILED DESCRIPTION

Figure 1:
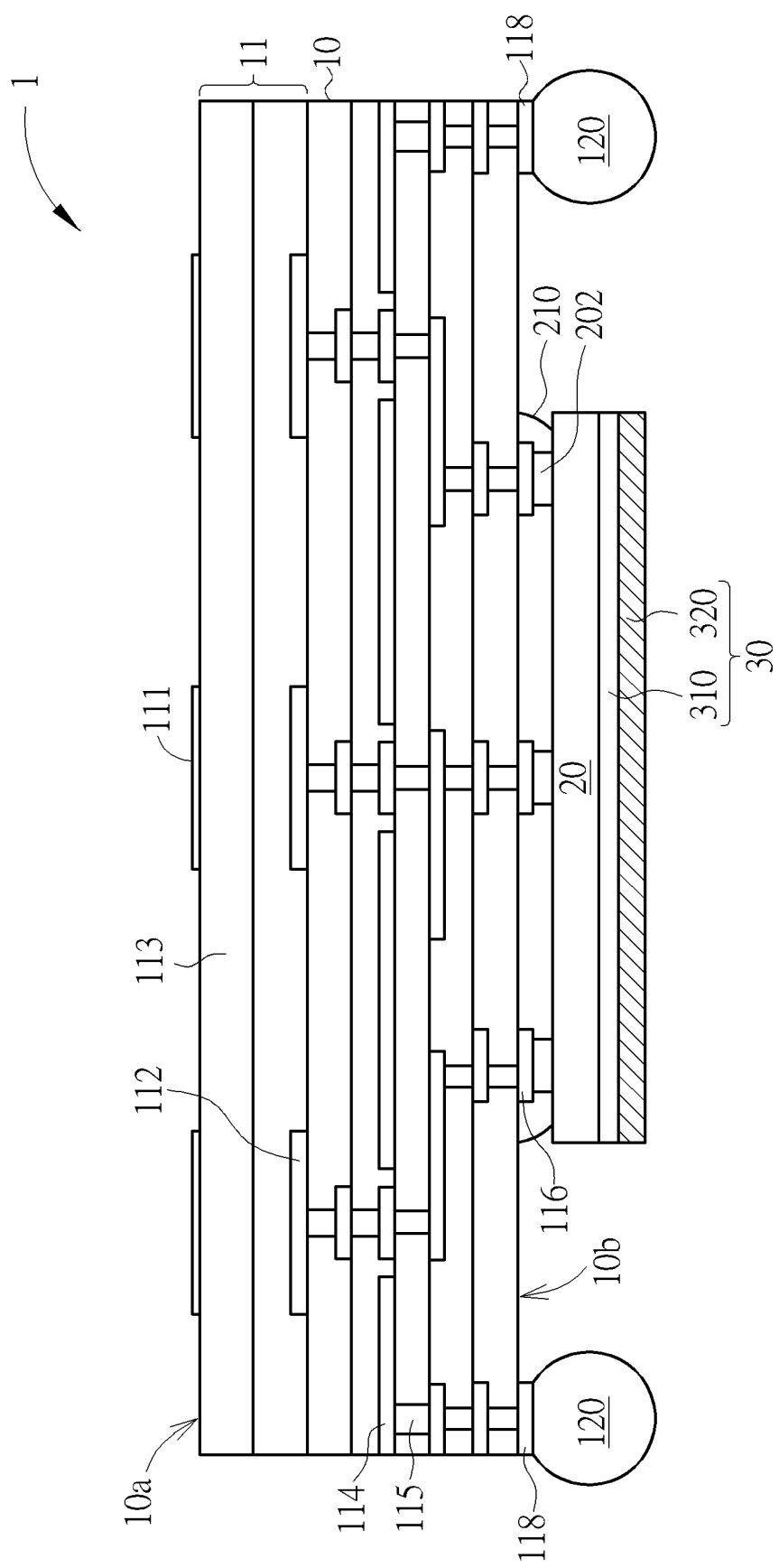
FIG. 1 is a cross-sectional view of a semiconductor package according to one embodiment of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

In general, the present disclosure pertains to a semiconductor package comprising at least one integrated circuit (IC) die attached to a substrate in, for example, a "flip chip" configuration. In such a flip chip configuration, bumps are formed on signal pads or terminals of the IC die, and the IC die may be inverted ("flipped") and attached to substrate by reflowing bumps so that they attach to corresponding pads on the surface of substrate. The IC die may be one of the many types of IC dies. For example, IC die may be a radio-frequency (RF) IC die, a microprocessor die, an application-specific integrated circuit (ASIC), or a memory die according to various embodiments.

The substrate may be one of the different types of substrates known to those skilled in the relevant arts (e.g., organic or inorganic substrates). The substrate may be made from one or more conductive layers bonded with a dielectric material. For example, the dielectric material may be made from various substances, such as bismaleimide triazine (BT). The conductive layers may be made from a metal, or combination of metals, such as copper and aluminum, that facilitate coupling between IC die and solder balls. Trace or routing patterns may be made in the conductive layer by, for example, etching the conductive layer. The substrate may be a single-layer, a two-layer, or multi-layer substrate.

The exemplary semiconductor package may be a RFIC chip package with antenna array structure that is particularly suited for millimeter wave (mmW) applications or radar systems. However, it is to be appreciated that the principles of the present invention should not be limited to any particular package type or IC die. Rather, the principles of the invention are directed broadly to techniques for improved thermal interface material application in the fabrication process of a printed circuit board (PCB) assembly that includes an integrated circuit package and a heat transfer device.

FIG. 1 is a schematic, cross-sectional diagram showing an exemplary semiconductor package in accordance with one embodiment of the invention. As shown in FIG. 1, the semiconductor package 1 comprises a base 10 having a radio-frequency (RF) structure 11 embedded near an upper surface 10a of the base 10. In some embodiment, the base 10 could be a package substrate, a silicon interposer or a printed circuit board (PCB). In other embodiments, the radio-frequency (RF) structure 11 may comprise an antenna array, for example, the radio-frequency (RF) structure 11 may comprise a top antenna layer 111 and a bottom antenna layer 111 spaced apart from the top antenna layer 111. For example, at least one dielectric layer 113 may be interposed between the top antenna layer 111 and the bottom antenna layer 112. According to one embodiment, the top antenna layer 111 and the bottom antenna layer 112 may be formed in the upper metal layers of the base 10, but not limited thereto. The base 10 may comprise metal traces 114 and vias 115 for interconnection.

According to one embodiment, for example, the semiconductor package 1 may further comprise an IC die 20 such as an RFIC die mounted on the lower surface 10b of the base 10. The IC die 20 may be mounted on the lower surface 10b in a flip-chip manner so that the backside 20b of the IC die 20 is exposed and available for heat dissipation. The flip-chip type connection is a method for interconnecting a flipped IC die 20 to external circuitry with bumps 202 such as micro bumps or copper pillar bumps disposed on the chip pads of the IC die 20. The bumps 202 are aligned with and electrically connected to the copper pads 116 disposed at the lower surface 10b of the base 10. Optionally, an underfill 210 may be applied to the gap between the IC die 20 and the lower surface 10b of the base 10.

According to one embodiment, for example, the semiconductor package 1 may further comprise a plurality of conductive pads 118 disposed on the lower surface 10b of the base 10 and arranged around the IC die 20. The conductive pads 118 may be electrically connected to the circuit including the RF structure 11 of the base 10 through the metal traces 114 and vias 115. A plurality of conductive structures 120 such as ball grid array (BGA) balls may be disposed on the conductive pads 118, respectively, for electrically connecting the circuit including the RF structure 11 11 of the base 10 with the external circuit device such as a printed circuit board (PCB).

According to one embodiment, for example, the semiconductor package 1 may further comprise a metal thermal interface layer 30. The metal thermal interface layer 30 may be a metal bi-layer structure comprising a backside metal layer 310 that is in direct contact with the backside 20b of the IC die 20, and a solder paste 320 conformally printed on the backside metal layer 310. According to one embodiment, preferably, the backside metal layer 220 may comprise Au, but not limited thereto. For example, the backside metal layer 220 may be Au layer that is sputtered onto the backside 20b of the IC die 20.

For example, the solder paste (or pre-solder) 320 may be formed by stencil printing methods, but not limited thereto. For example, the solder paste 320 may comprise any lead-free solders in commercial use, which may contain tin, copper, silver, bismuth, indium, zinc, antimony, and traces of other metals. According to one embodiment, for example, the solder paste 320 may be thicker than the backside metal layer 310. It is noteworthy that the metal thermal interface layer 30 does not comprise a conventional thermal interface material (TIM) such as thermal grease or conductive polymer.

According to one embodiment, the combined thickness of the underfill 210, the IC die 20, and the metal thermal interface layer 30 is substantially equal to the ball height h of the conductive structures 120 measured from the lower surface 10b of the base 10.

Figure 2:
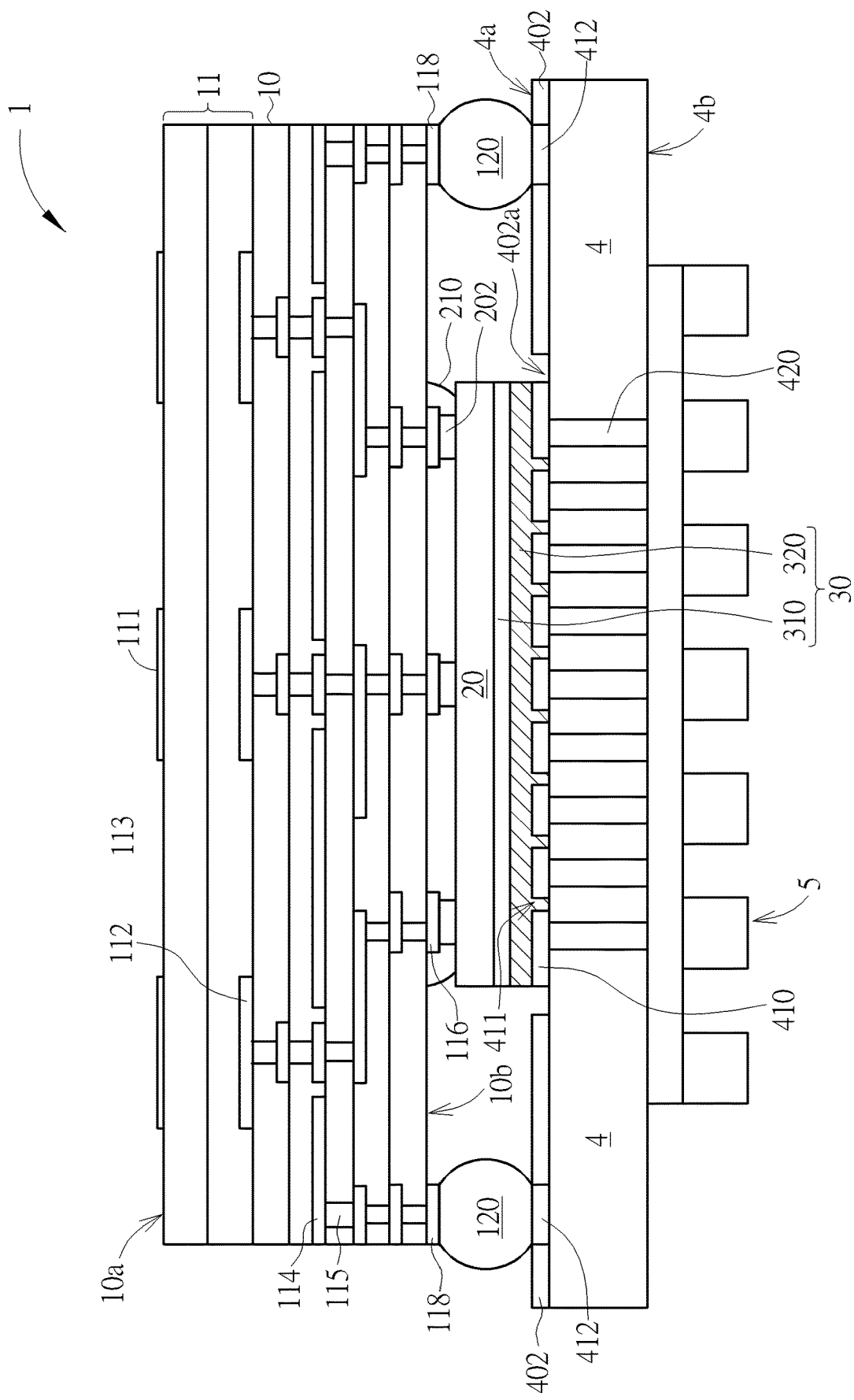
FIG. 2 is a schematic, cross-sectional diagram showing an exemplary PCB assembly including the semiconductor package in FIG. 1 according to one embodiment of the invention.

Please refer to FIG. 2. FIG. 2 is a schematic, cross-sectional diagram showing an exemplary PCB assembly including the semiconductor package in FIG. 1 according to one embodiment of the invention. As shown in FIG. 2, the exemplary PCB assembly 2 comprises a PCB 4 having an upper surface 4a directly facing the lower surface 10b of the base 10. According to one embodiment, an array of copper thermal pads 410 may be disposed within a solder resist opening 402a in the solder resist layer 402 on the upper surface 4a of the PCB 4.

According to one embodiment, the span of the array of conductive thermal pads 410 may be in commensurate with the area of the backside 20b of the IC die 20. According to one embodiment, the span of the array of conductive thermal pads 410 may be slightly greater than the area of the backside 20b of the IC die 20. For example, the distance from the edge of the IC die 20 to the perimeter of the array of conductive thermal pads 410 may be about 150 micrometers, but not limited thereto.

According to one embodiment, slits or gaps 411 may be formed between the adjacent conductive thermal pads 410. According to one embodiment, a plurality of thermal vias 420 is formed within the PCB 4 under the array of the conductive thermal pads 410. According to one embodiment, the thermal vias 420 are in thermal contact with the conductive thermal pads 410, respectively. According to one embodiment, the thermal vias 420 are plated though holes. According to one embodiment, a heat spreading structure 5 such as a heat sink may be mounted onto the lower surface 4b of the PCB 4. The heat spreading structure 5 is in thermal contact with the thermal vias 420.

According to one embodiment, the semiconductor package 1 as depicted in FIG. 1 is mounted onto the upper surface 4a of the PCB 4 such that the solder paste 320 is laminated onto the array of conductive thermal pads 410. With suitable pressing force, the solder paste 320 may be forced (or squeezed) into the slits 411. By providing such configuration, more heat dissipating surface area may be produced. The conductive structures 120 are aligned with matching pads 412 on the upper surface 4a of the PCB 4. The solder paste 320 and the conductive structures 120 may be subjected to a reflow process so as to form permanent bond. The metal thermal interface layer 30 is used as a high-efficiency heat transfer medium that allows heat energy to rapidly move from the IC die 20 to the conductive thermal pads 410 and plated thermal vias 420 of the PCB 40 to the heat spreading structure 5. Further, it is advantageous to use the present invention because the adhesion between the semiconductor package 1 and the PCB 4 can be significantly improved.

Please refer to FIG. 3 to FIG. 6. FIG. 3 to FIG. 6 are schematic, cross-sectional diagrams showing semiconductor packages in accordance with various embodiment of the invention. For example, the illustrative semiconductor packages may be a hybrid CSP having a flip-chip die and a wire-bonded die stacked on the flip-chip die.

Figure 3:
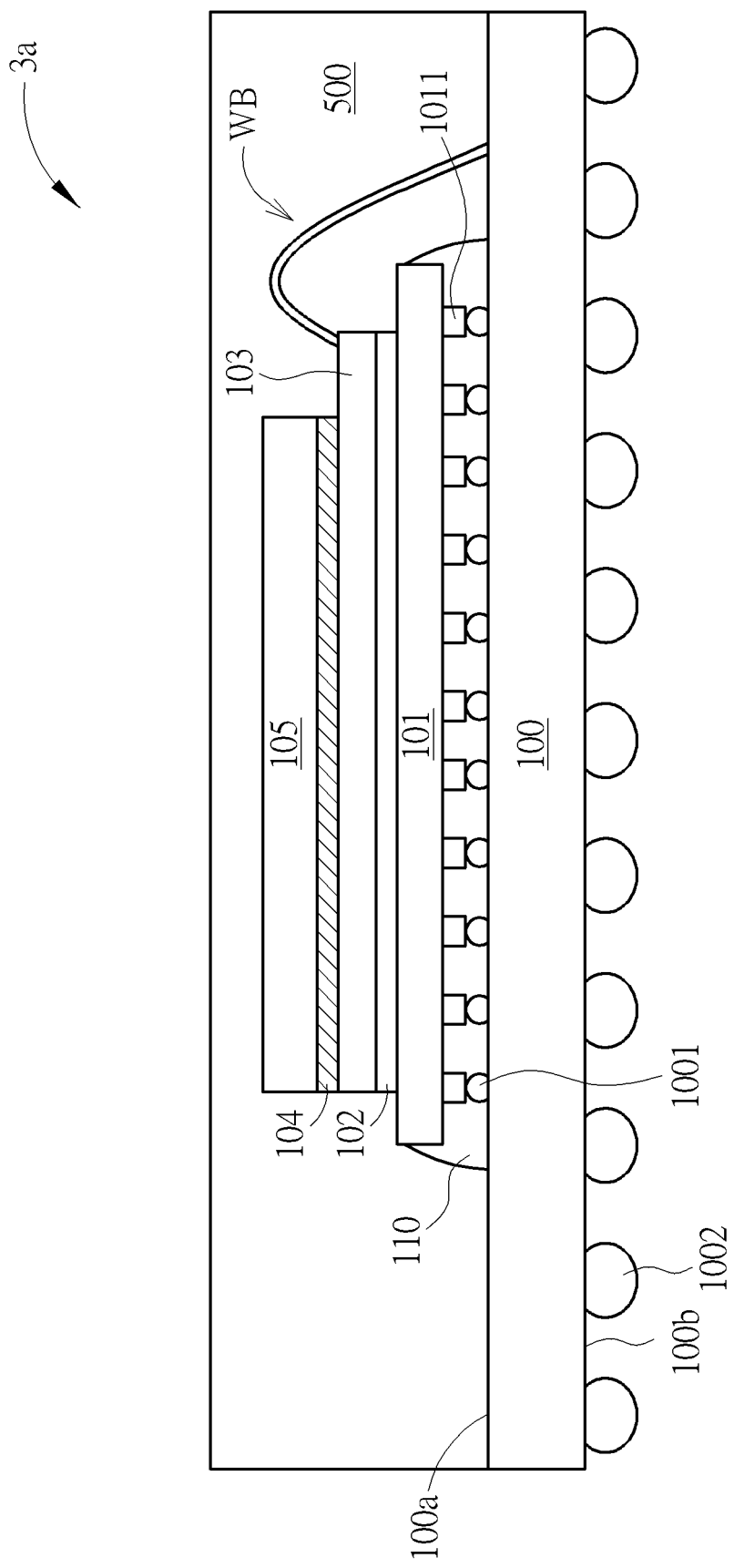
FIG. 3 to FIG. 6 are schematic, cross-sectional diagrams showing semiconductor packages in accordance with various embodiment of the invention.

As shown in FIG. 3, the semiconductor package 3a comprises a base 100 having a top surface 100a and a bottom surface 100b. A plurality of connecting elements 1002 such as solder balls may be disposed on the bottom surface 100b for further connection. A semiconductor chip 101 is mounted on the top surface 100a of the base 100. In a non-limiting example, the semiconductor chip 101 may be a system-on-a-chip (SoC) and may generate heat during operation.

According to one embodiment, the semiconductor chip 101 may be mounted on the top surface 100a in a flip-chip manner by aligning and connecting the bumps (micro bumps or copper pillar bumps) 1011 on the active surface of the semiconductor chip 101 with the matching pads 1001 on the top surface 100a of the base 100. An optional underfill 110 may be applied to fill the gap between the semiconductor chip 101 and the top surface 100a of the base 100.

According to one embodiment, a semiconductor chip (or package) 103 may be stacked directly on the semiconductor chip 101 and may be electrically coupled to the base 10 by using wire bonding WB. In a non-limiting example, the semiconductor chip 103 may be a memory chip; In another example, the semiconductor chip 103 may be a Known Good Die (KGD) chip, but is not limited thereto. According to one embodiment, the semiconductor chip 103 may be adhered to the top surface of the semiconductor chip 101 by using a die attach film (DAF) 102 comprising, for example, an epoxy adhesive layer. According to one embodiment, for example, the DAF 102 has thermal conductivity of about 0.3 W/m-K.

According to one embodiment, the semiconductor package 3a further comprises an in-package heat dissipating element 105 such as a dummy silicon die that is adhered on the top surface of the semiconductor chip 103 by using a high-thermal conductive die attach film (high-thermal conductive DAF) 104. According to one embodiment, the high-thermal conductive DAF 104 is an adhesive film with high thermal conductive property. According to one embodiment, the high-thermal conductive DAF 104 has a higher thermal conductivity than that of the DAF 102. According to one embodiment, for example, the high-thermal conductive DAF 104 may have thermal conductivity of about 2-50 W/m-K.

According to one embodiment, the semiconductor package 3a further comprises a molding compound 500 that encapsulates the semiconductor die 101, the semiconductor die 103, and the heat dissipating element 105. According to one embodiment, for example, the molding compound 500 may have thermal conductivity of about 2-8 W/m-K; for another example, the molding compound 500 may have thermal conductivity of 1 W/m-K.

Figure 4:
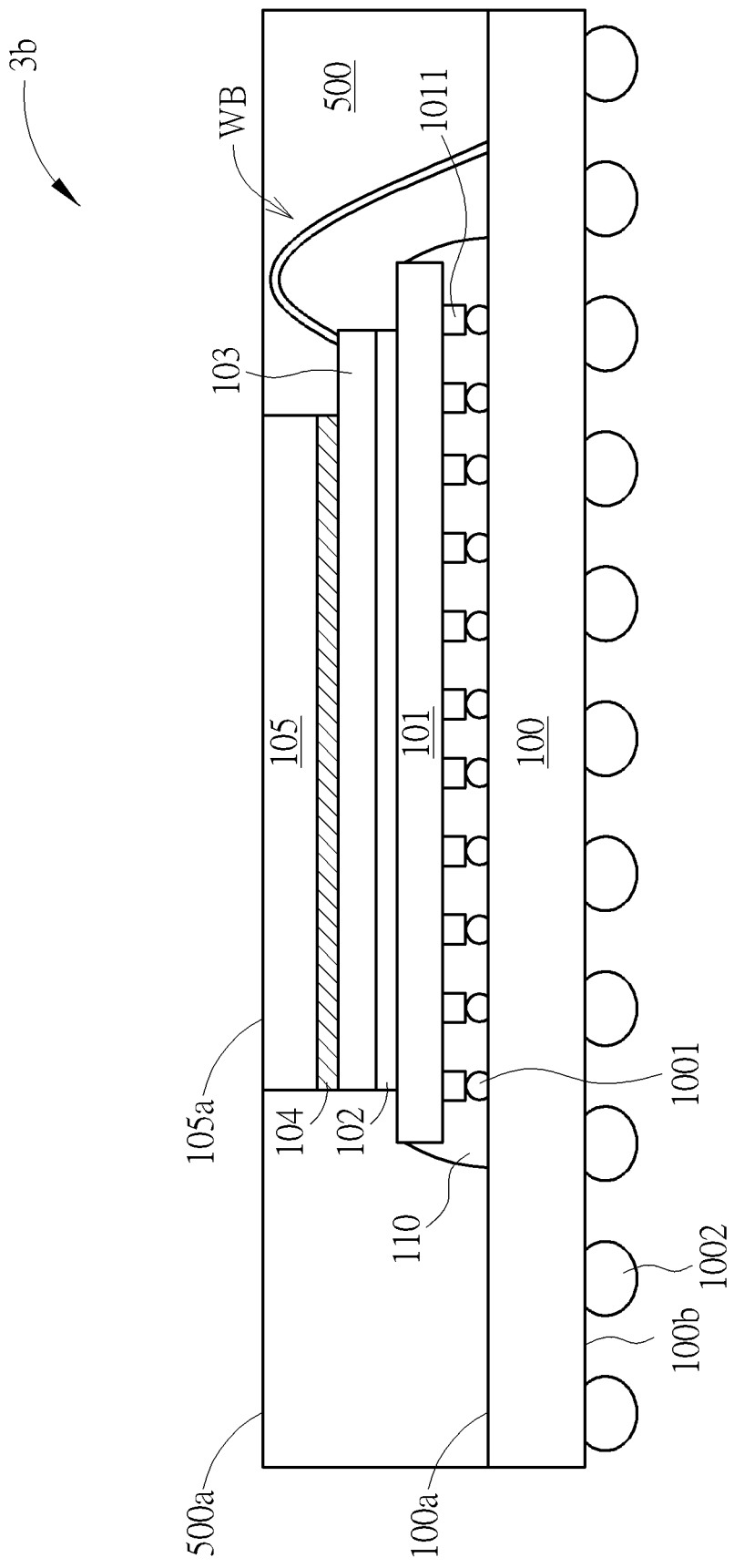

In FIG. 4, likewise, the semiconductor package 3b comprises a base 100, a semiconductor chip 101 such as an SoC mounted on the base 100 in a flip-chip manner, a semiconductor chip 103 such as a DRAM chip adhered onto the semiconductor chip 101 by using a DAF 102, a heat dissipating element 104 such as a dummy silicon die adhered onto the semiconductor chip 103 by using a high-thermal conductive DAF 104. The difference between the semiconductor package 3a in FIG. 3 and the semiconductor package 3b in FIG. 4 is that the top surface 105a of the heat dissipating element 105 is exposed to air. To form such configuration, the molding compound 500 may be subjected to a polishing or grinding process. After removing a portion of the molding compound 500, the top surface 105a of the heat dissipating element 105 may be flush with the top surface of the molding compound 500.

Figure 5:
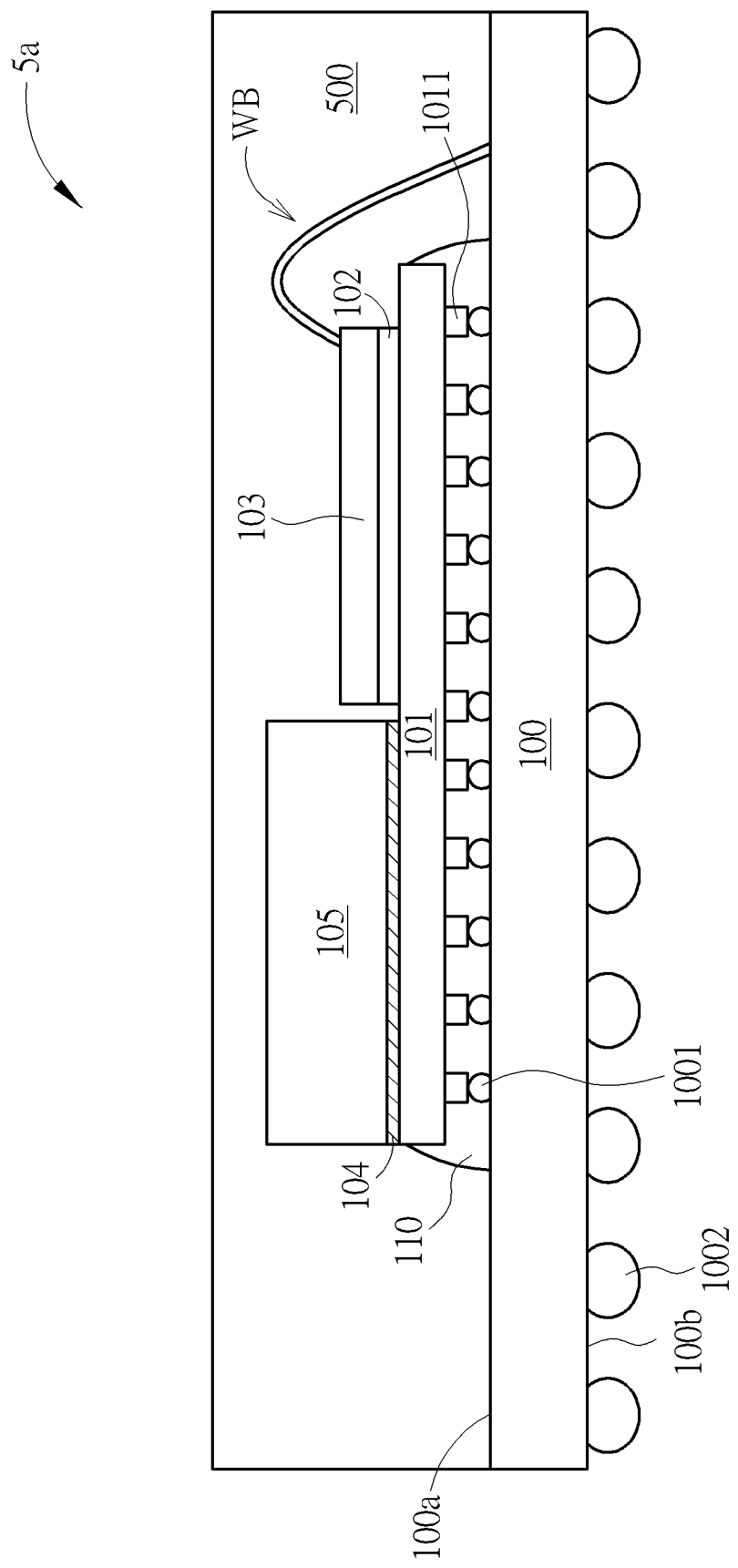

In FIG. 5, instead of attaching the heat dissipating element 105 onto the semiconductor die 103, the heat dissipating element 105 of the semiconductor package 5a is attached to the top surface of the semiconductor die 101 by using a high-thermal conductive DAF 104 as previously described. Therefore, the semiconductor die 103 and the heat dissipating element 105 are both attached onto the top surface of the semiconductor die 101 in a side-by-side manner.

Figure 6:
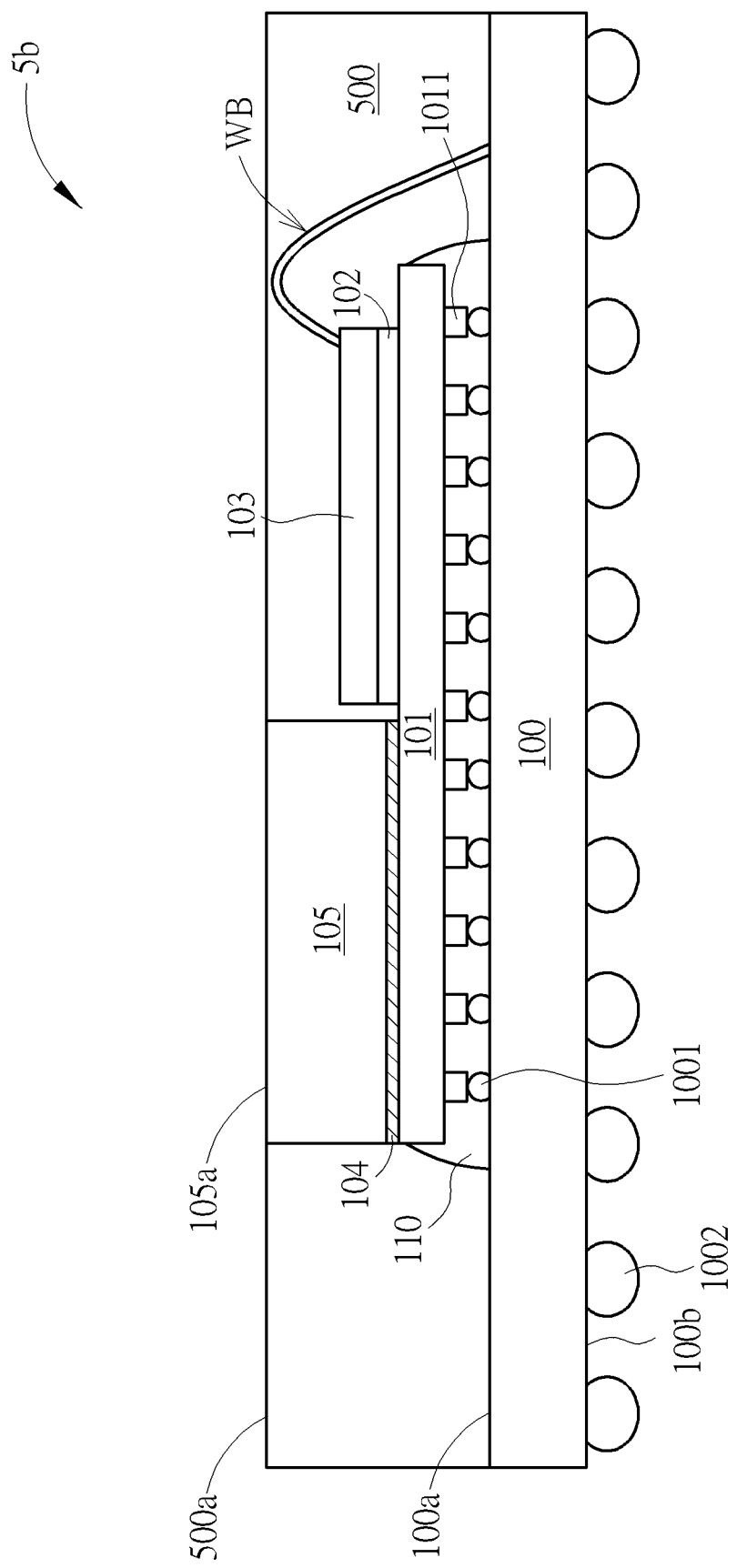

In FIG. 6, likewise, the semiconductor package 5b comprises a base 100, a semiconductor chip 101 such as an SoC mounted on the base 100 in a flip-chip manner, a semiconductor chip 103 such as a DRAM chip adhered onto the semiconductor chip 101 by using a DAF 102, a heat dissipating element 104 such as a dummy silicon die adhered onto the semiconductor chip 101 by using a high-thermal conductive DAF 104. The difference between the semiconductor package 5a in FIG. 5 and the semiconductor package 5b in FIG. 6 is that the top surface 105a of the heat dissipating element 105 is exposed to air.

According to one embodiment, the semiconductor chip 101 is a major heat source of the semiconductor package 3a and the heat needs to be rapidly removed from the semiconductor package 3a to the ambient environment. By providing the configuration through FIG. 3 to FIG. 6, the thermal performance is significant improved (~50% improvement). For example, the measured theta JC ($\theta_{JC}$) of the illustrative semiconductor package 5b in FIG. 6 may be about 2.20.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
   a base comprising an upper surface and a lower surface that is opposite to the upper surface;
   a radio-frequency (RF) structure embedded near the upper surface of the base;
   an integrated circuit (IC) die mounted on the lower surface of the base in a flip-chip manner so that a backside of the IC die is available for heat dissipation;
   a plurality of conductive structures disposed on the lower surface of the base and arranged around the IC die;
   a metal thermal interface layer comprising a backside metal layer that is in direct contact with the backside of the IC die, and a solder paste conformally printed on the backside metal layer; and
   a print circuit board (PCB) having an upper surface directly facing the lower surface of the base, wherein the PCB comprises an array of conductive thermal pads on the upper surface of the PCB, a plurality of thermal vias within the PCB under the array of copper thermal pads, a heat spreading structure mounted onto a lower surface of the PCB, wherein the heat spreading structure is in thermal contact with the plurality of thermal vias, wherein the array of conductive thermal pads comprises slits between the thermal pads and the slits are filled with the solder paste.

2. The semiconductor package according to claim 1, wherein the RF structure comprises a top antenna layer and a bottom antenna layer spaced apart from the top antenna layer, and at least one dielectric layer interposed between the top antenna layer and the bottom antenna layer.

3. The semiconductor package according to claim 1, wherein the backside metal layer comprises Au.

4. The semiconductor package according to claim 1, wherein the solder paste comprises lead-free solder comprising tin, copper, silver, bismuth, indium, zinc, or antimony.

5. The semiconductor package according to claim 1, wherein the base comprises metal traces and vias for interconnection.

6. The semiconductor package according to claim 5, wherein the conductive structures are electrically connected to the RF structure of the base through the metal traces and vias.

7. The semiconductor package according to claim 1, wherein the IC die is an RFIC die.

8. The semiconductor package according to claim 1 further comprising:
   an underfill disposed in a gap between the IC die and the lower surface of the base.

9. The semiconductor package according to claim 8, wherein a combined thickness of the underfill, the IC die, and the metal thermal interface layer is substantially equal to a ball height of the solder balls measured from the lower surface of the base.

10. The semiconductor package according to claim 1, wherein the solder paste is thicker than the backside metal layer.

11. The semiconductor package according to claim 1, wherein the semiconductor package is mounted on the array of conductive thermal pads.

12. The semiconductor package according to claim 1, wherein the plurality of thermal vias comprises plated though holes.

13. The semiconductor package assembly according to claim 1, wherein the heat spreading structure comprises a heat sink.

14. The semiconductor package according to claim 1, wherein the solder paste is in direct contact with the array of conductive thermal pads.

* * * * *